United States Patent [19]
Pennell

[11] Patent Number: 5,828,867
[45] Date of Patent: Oct. 27, 1998

[54] METHOD FOR DISCRETE DIGITAL EVENT SIMULATION

[75] Inventor: James Phillip Pennell, Woodbridge, Va.

[73] Assignee: Lucent Technologies Inc., Murray Hill, N.J.

[21] Appl. No.: 872,091

[22] Filed: Jun. 10, 1997

Related U.S. Application Data

[63] Continuation of Ser. No. 286,062, Aug. 4, 1994, abandoned.

[51] Int. Cl.$^6$ ...................................................... G06F 9/455
[52] U.S. Cl. ............................................................ 395/500
[58] Field of Search ............................. 364/578; 395/500

[56] References Cited

U.S. PATENT DOCUMENTS

| | | | |
|---|---|---|---|
| 4,965,743 | 10/1990 | Malin et al. ............................. | 364/578 |
| 5,148,379 | 9/1992 | Konno et al. ............................. | 364/578 |
| 5,151,984 | 9/1992 | Newman et al. ......................... | 395/500 |
| 5,327,361 | 7/1994 | Long et al. ................................ | 364/57 |
| 5,438,526 | 8/1995 | Itoh et al. ................................. | 364/578 |

*Primary Examiner*—Kevin J. Teska
*Assistant Examiner*—Ayni Mohamed

[57] ABSTRACT

A method for re-configuring a pre-compiled discrete-event digital simulation program. The method comprises the steps of creating a template having a series of generic tasks and incorporating the template onto a computer to create a generic computer simulation. Next information associated with the steps of a process are input on the computer. The information includes the time duration of each step and the resources expended in accomplishing each step. Finally, the step information is applied to the generic computer simulation to create the discrete event simulation model of the process.

12 Claims, 3 Drawing Sheets

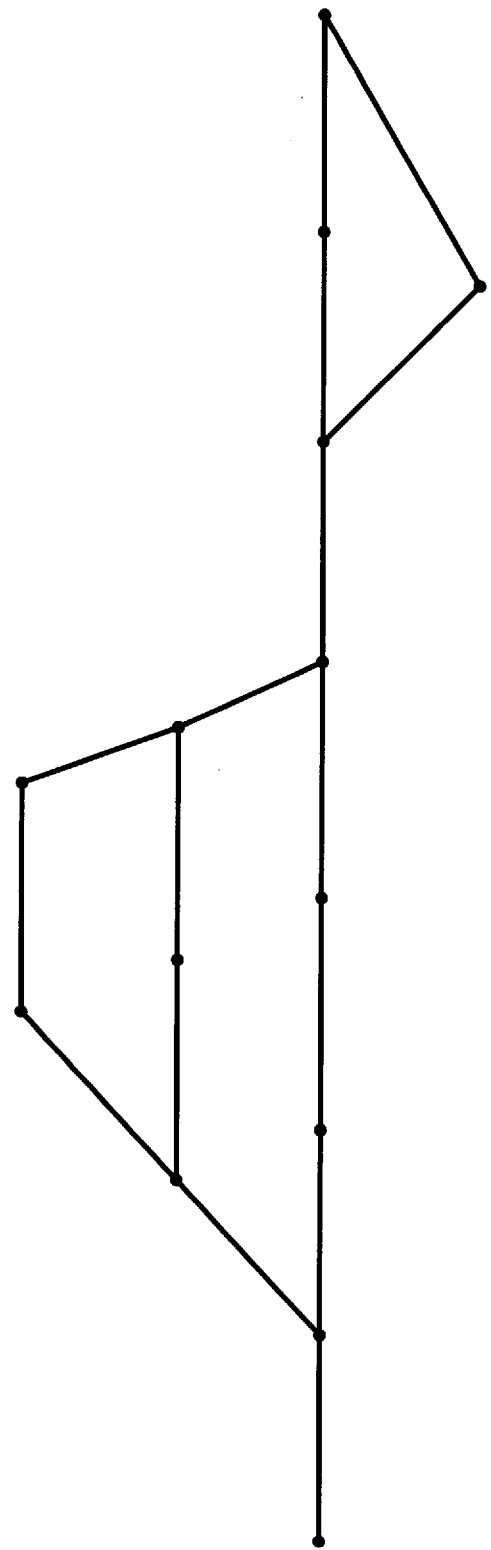

ically apported tailoring the components to behave like the
METHOD FOR DISCRETE DIGITAL EVENT SIMULATION This is a continuation of application Ser. No. 08/286,062, filed on Aug. 4, 1994 and now abandoned.

FIELD OF THE INVENTION

The present invention relates to a method for preparing computer simulations. More particularly, the present invention relates to a method for re-configuring a pre-compiled discrete-event digital simulation program.

BACKGROUND OF THE INVENTION

Computer simulations are often utilized to analyze complicated systems that change over time. Computer simulation is ideally applied to any process where limited resources must be allocated in the face of uncertain demands. Where the demands are definite or the resources are unlimited, it is relatively simply to calculate and analyze the needs of a process. However, when limited resources must be allocated amongst uncertain demands, it becomes very difficult to optimize the process.

For example, computer simulations are readily applicable in analyzing business processes, manufacturing processes, meteorological phenomena, and aerodynamic design, in addition to a host of other systems. For example, a computer simulation modelling a business process would likely be a computer software program designed to simulate the specific business process.

Discrete event digital simulation models have been utilized to optimize decision making associated with designing new processes, products, or manufacturing techniques. Once important dependencies and performance characteristics of a process are captured in a discrete event simulation model, the model can be used to explore the effects of making changes to the process.

Specifically, a digital simulation program is a computer program that simulates the behavior of a process that changes over time by selecting a number of interesting events and advancing the program clock between the event times. Each time the program clock is advanced, the program calculates the changes in the attributes that are being studied. For example, a fast food restaurant might consider a customer arrival, a customer placing an order, a customer paying, a customer receiving their food, and a customer leaving as the only interesting events associated with the sale of food at their restaurant. The simulation program would advance its clock as the customer moves from event to event, collect the appropriate statistics, and then move the customer in accordance with the type of event.

Discrete event digital simulation can also be used to reduce the risk associated with business process re-engineering, aid in the design of airplanes, determine weather patterns, help scientists determine appropriate methods for placing chemicals in the atmosphere, optimize traffic flow, or calculate the appropriate size and configuration of a computer system or network needed to achieve specific business goals.

Much of discrete event simulation modeling is based upon "queuing theory". Queuing theory analyzes the time needed to accomplish a specific task and the resources expended in accomplishing the task. Generally, the necessary time and resources are determined through the use of queuing theory used in computer simulations by generating a list of events that must take place to complete a process and the resources (for example, people, computer time) used during each event in the process. As the clock moves, the simulation moves from one event to another event in accordance with the predetermined parameters and the resources are allocated accordingly.

Development of simulation programs is often time consuming and difficult. In response, software vendors have developed products, called simulation languages, to simplify the task of writing simulation programs. Generally, simulation languages include commonly used components, such as a unit to generate arrivals according to one of several profiles, and provide a convenient way for arranging the components and tailoring them to replicate the business process under consideration. In use, an analyst must select the desired components, arrange the components in a pattern that resembles the business process being analyzed, and supply values tailoring the components to behave like the real process. The result is a "program" in the simulation language. This program is translated into something called an "executable" program consisting of instructions that can be understood by the computer being used.

When currently available simulation techniques are used, a new computer simulation program must be constructed each time a process is considered for re-engineering. The time needed to develop and debug a model of a moderately complex process ranges from two weeks to two months. In addition to creating the model in the simulation language, the analyst must convert the model into a computer program and verify that the resulting computer program is free of errors and replicates the behavior of the process. As a result, the total time necessary to develop a useful simulation model is often a barrier to using a simulation model if there is an urgent need to change a business process.

Viewing the prior art, a need currently exists for a method permitting efficient, complete, and time effective development of useful simulations. The present invention accomplishes this.

BRIEF SUMMARY OF THE INVENTION

A feature of the present invention is to provide a method for preparing a discrete event simulation program that eliminates the need to re-design, re-compile, re-build, and debug the simulation program each time new processes, products, or manufacturing technique is analyzed.

Another feature of the present invention is the provision of a method which permits a discrete event digital simulation program to support a fractional factorial design of an experiment without recompilation between experiments.

A further feature of the present invention is that it eliminates the need for separate simulation models when the duration of events to be studied differs by greater than three orders of magnitude.

These and other features are provided by the present invention which includes a method for reconfiguring a pre-compiled discrete-event digital simulation program. The method comprises the steps of creating a template composed of generic process tasks and incorporating the template onto a computer to create a generic computer simulation. Next information associated with the tasks of a process are input on the computer. The information includes the time duration of each task and the resources expended in accomplishing each task. Finally, the step information is applied to the generic computer simulation to create the discrete event simulation model of the process.

Other objects, advantages and salient features of the invention will become apparent from the following detailed description, which taken in conjunction with the annexed drawings, discloses the preferred embodiment of the present invention.

BRIEF DESCRIPTION OF THE DRAWINGS

FIG. 3 is a graph of a process.

DETAILED DESCRIPTION OF THE PREFERRED EMBODIMENTS

The present invention provides a method for conducting discrete event simulation modeling in an efficient, simple, and cost effective manner. Specifically, the method facilitates reconfiguring a pre-compiled discrete-event digital simulation program.

Briefly, a general purpose template for modeling any process, product, or manufacturing technique, a separate program that creates files containing information about particular steps in the process and the arrangement of those steps, and a method for using these tools to analyze a complex processes are defined by the present invention.

Although the present invention may be utilized to model and analyze a wide variety of situations, including processes, product design, and manufacturing techniques, the term "process" will be used to generally describe such situations throughout the detailed description and claims. This is being done for the sake of brevity, and should not be construed to limit the scope of the present invention.

First, a generic template is provided. The generic template contains a working model for evaluating a series of generic tasks involved with the process being modeled. The template is based upon the understanding that most processes utilize a limited number of generic tasks, which do not vary from process to process. As such, the template is designed to incorporate each step of a process to create a discrete event simulation model of the process being considered.

Figure 1:
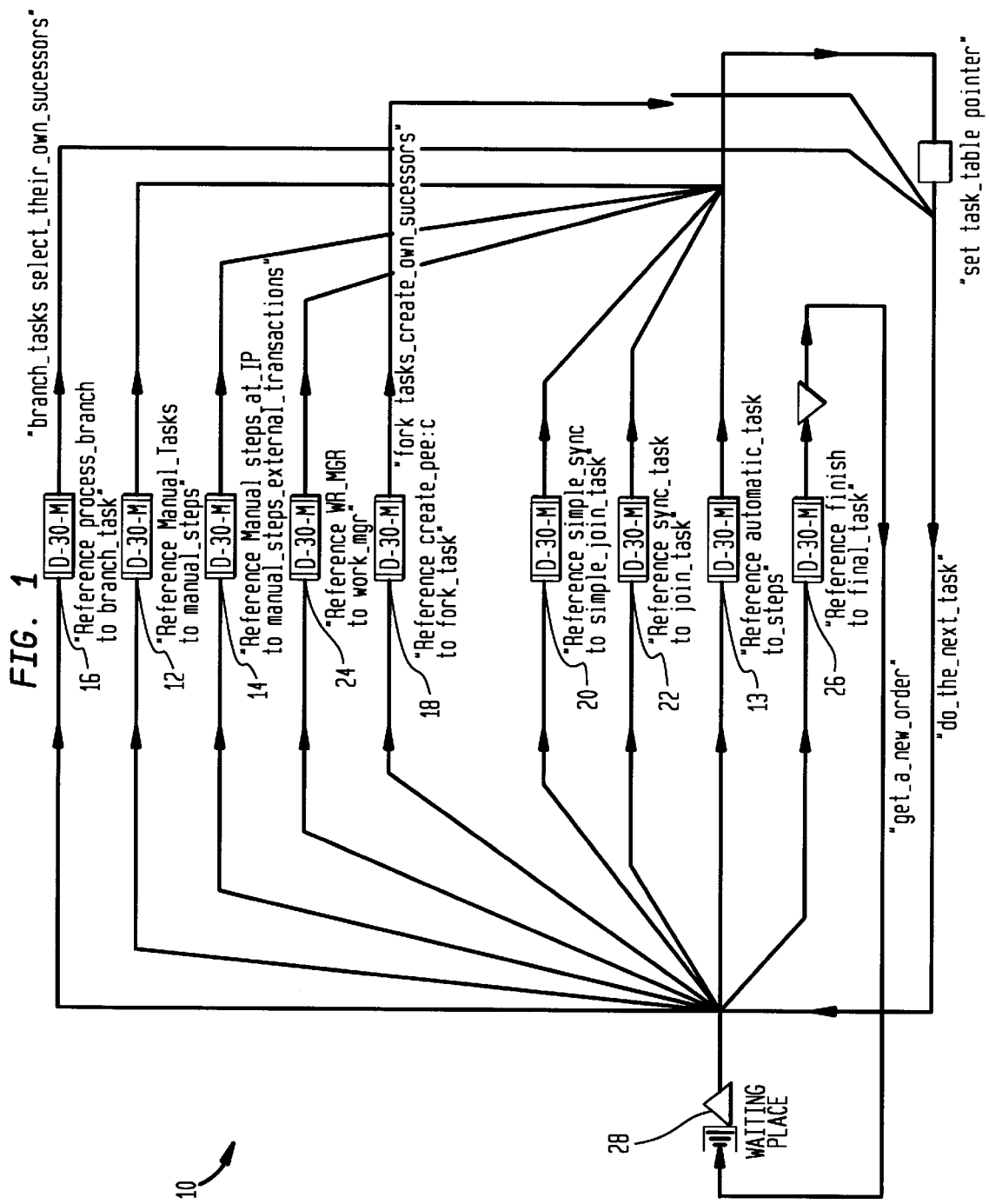
FIG. 1 is a flow chart representative of the generic template.

For example, the template 10 shown in FIG. 1, includes a series of generic tasks placed at the boundary of mirror image dendrites. The generic tasks incorporated into the template include manual tasks 12 (i.e., tasks performed by workers which require only local resources), automatic tasks 13 (i.e., tasks performed by a computer system), manual tasks requiring remote resources 14, branch tasks 16 (i.e., tasks which may ultimately cause the process to go in one direction or another), fork tasks 18 (i.e., tasks leading to a plurality of tasks), join tasks 20, 22 (i.e., instances where two tasks subsequently lead to a single task), work manager tasks 24 (i.e., tasks relating to the management of the proper allocation of work during the process; it may involve manual steps performed by a worker to distribute work or automatic steps performed by a computer system to determine the allocation of work), and a final step task 26 (i.e., a task which says that the process is complete and determines what should be the subsequent process). The template 10 also includes a waiting place 28 where a new process would begin.

Although the preferred embodiment of the present invention is limited to the generic tasks outlined above, it is certainly within the scope of the present invention to modify the generic template to accommodate other generic tasks. In fact, such modifications can be readily accomplished, thus, adding to the simplicity and versatility of the present invention.

Each of the generic tasks is modeled as a sequence of computer simulation language components that simulate the dedication of a variety of resources for appropriate lengths of time or that perform bookkeeping actions to model the synchronization and control of activities in the simulation program. The necessity of the generic task will become apparent from the following discussion.

To effectively utilize the present invention the template 10 is ultimately incorporated into a computer usable form and input on a computer system. Specifically, the template is converted into a generic computer simulation program. In the preferred embodiment of the present invention this conversion is accomplished using an SES/workbench onto which the generic template is input. Once the template is input onto the computer workstation as a generic computer simulation program, it is ready to be used in conjunction with files containing specific information relating to the process being studied.

For each simulation it is necessary to create two files which are developed through the aid of a tailoring program. The tailoring program prompts a user to supply necessary information which is used to create a pair of files that are applied to the template. For example, the information shown in FIG. 2 must be input to the tailoring program.

Specifically, the tailoring program is designed to accumulate and assimilate information which the template uses to ultimately simulate the process and properly allocate resources. Resources considered by the tailoring program, and the template, include worker time to accomplish specific steps, worker think time used in accomplishing specific tasks, database availability and use, server availability and use, as well as a wide variety of other resources that may be relevant in completing a process.

Figure 2:
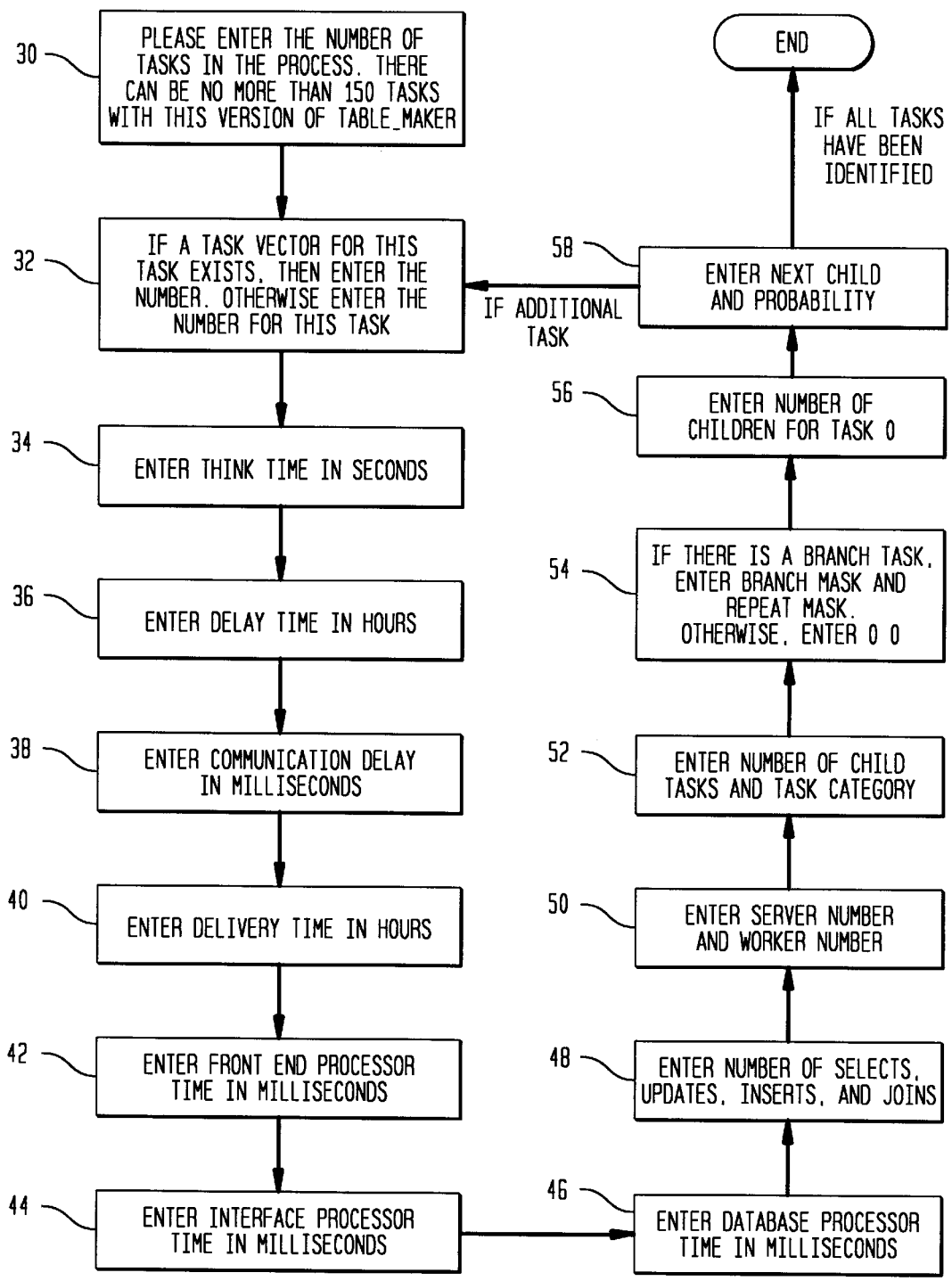
FIG. 2 is a flow chart representative of the tailoring program

With reference to FIG. 2, a user must first enter the number of tasks, or steps, in the process 30. Then the tailoring program gathers information regarding each step in the process 32. For example, the user must input the worker's think time 34 and the worker's delay time 36 in accomplishing the task. Further, if the task requires external communications (i.e., resources), the time required must be entered 38, or if there is delay in delivering the results of the task, the required time must be entered 40. With regard to automatic tasks requiring the use of a computer system, it is necessary to enter the front end processor time 42, the interface processor time 44, and the database processor time 46. Additionally, the selects, updates, inserts and joins (the generic database operations) of the server must also be provided for automatic tasks 48. Further, the server and the worker must be identified using numbers representing the server or worker performing the task 50. Next, the number of child tasks associated with the task must be provided 52. Also the task category (see generic tasks discussed above) must be identified using a number representative of a specific task 52. Finally, a user must identify the branching characteristics of the present task 54, whether the present task has any children 56, and what is the likelihood of the next task to follow the present task 58. As with the template, the tailoring program outlined above is merely exemplary, and could readily be modified to accommodate specific features of other processes.

The two files created by the tailoring program are based upon the information input by the user. Specifically, the tailoring program generates a first file containing representation of a graph of the steps in the process. As shown in FIG. 3, the graph of the process sets forth the steps necessary to accomplish the process, that is, the graph is composed of nodes 60 (symbolic of each step) connected by arcs 62 (symbolic of preceding and following steps). The first file may also be referred to as the routing file, since it contains all the information necessary to determine the sequence of steps that must be performed in carrying out the process.

The second file created by the tailoring program contains, for each step in the real process, a list of the resources that are used in that particular step and the length of time that each resource will use.

In conjunction with the information contained in the first and second files, the generic template (i.e., the generic computer simulation) is ultimately used to create a discrete event simulation model of the process being studied. That is, the generic computer simulation program reads the files and uses the information to make itself behave like the process under study.

The information contained in first and second files is applied to the generic template in the following manner. The generic template includes generic tasks that are applicable to a variety of processes. As stated previously, these tasks are modeled as a sequence of computer simulation language components that simulate the dedication of a variety of resources for appropriate lengths of time or that perform bookkeeping actions to model the synchronization and control of activities in the simulation program.

The generic tasks are placed at the boundary of mirror image dendrites (i.e., branches) as shown in FIG. 1. Each step or transaction in the process is represented by packet which is screened by logic contained in the branches leading the generic tasks. The packets collect historical data about the transaction including the packets present position in the process. Each packet contains the information from the first and second files necessary for the generic tasks to properly create the process being simulated.

As a packet, containing information regarding a step in the process, is presented to the generic task, the computer simulation language components modeling the task simulate the dedication of a variety of resources for appropriate lengths of time based upon the information contained in the packet. Additionally, the computer simulation language components perform bookkeeping actions to model the synchronization and control of activities in the simulation program based upon the information contained in each packet.

As one step in a process is completed the first and second files provide the information necessary to determine the timing of subsequent tasks and the type of task to be performed. This permits the simulation program to direct the packets to the appropriate generic task of the template. For example, as FIG. 1 shows, once a task is completed, the generic template 10 moves the packet to the left side of the dendrites where the appropriate next task is determined based upon the steps of the process outlined in the first and second files. With regard to the generic template shown in FIG. 1, the next task is determined by the first, or routing, file (see FIG. 3), with the exception of branch tasks and fork tasks. Branch tasks and fork tasks are those tasks which have predefined subsequent tasks, and, therefore, there is no need to consult the first file to determine what should be the next task.

When the final step of a process is completed, a packet is directed to the "Reference finish to final_task" 26 which sends the packet to get a new order at the "waiting_place" 28. That is, the simulation is complete, and the generic template 10 must await instructions to model a subsequent process.

The construction of each generic task allows an analyst to define values that capture events occurring over vastly different increments of time. Critical resource usage is modeled on a common clock that is incremented with a granularity sufficient to capture events at the human level, commonly seconds or minutes, and the computer system level, commonly at the millisecond level.

Events affecting the length of time needed to complete the process, but that do not involve critical resource usage, are modeled by advancing parallel, independent virtual clocks. That is, the time necessary to accomplish such tasks is stored in separate clocks and added to the process accounting at the end of the simulation. The separate clocks limit the number of tasks that must be stored and evaluated by the computer. For example, while the simulation clock captures events on the millisecond level, the parallel independent virtual clocks can capture the passage of time associated with activities such as the movement of packages between facilities, the completion of contracted activities, and the time spent waiting for outside events to occur.

In application, the simulation in accordance with the present invention can be viewed as a three-phase operation. The first phase generates packets that represent steps or transactions in the process. The second phase routes the packets among the generic tasks according to the information in the routing file, that is, the first file. At each generic task, the appropriate attributes of the transaction are updated. The third phase consists of the bookkeeping needed to complete the analysis of the process being studied.

Once a discrete event simulation model is created in accordance with the present invention, it is possible to alter the model to simulate a wide variety of processes which accomplish the same result.

The data obtained as a result of these simulation can be utilized to determine the most effective process. One analytical method used to optimize a process is often called design for experiments, and is discussed in detail by G. E. P. Box, W. G. Hunter, and J. S. Hunter in *Statistics for Experiments,* New York; John Wiley. Generally, the possible high and low values for various aspects of the process are determined, a series of simulations are conducted using the high and low values, and the results are analyzed to determine how to optimize the process.

The proposed method has been demonstrated using a commercial discrete event digital simulation product, SES/workbench, to create a generic process simulation program based upon the present inventions generic template. The topology of the process was captured as a matrix and stored in file. For each step in the process being simulated, a record was created that describes the resources used in the step, the length of time the resource is to be used, and the duration of any extraneous delays associated with the step. The simulation program, when invoked, reads the files, and thereby re-configures itself to become a model of the file described in the matrix and record array.

The present invention reduces the time needed to produce a useful simulation. With the present invention, the time needed to develop a simulation is reduced to less than one week. In addition, the present invention allows the analyst to conduct experiments with the simulation program to test the effect of changing a number of factors that might effect the business process.

While the preferred embodiment of the present invention has been shown and described, it will be understood that it is not intended to limit the disclosure, but rather it is intended to cover all modifications alternate methods falling within the spirit and scope of the invention as defined in the appended claims or their equivalents.

I claim:

1. A method for creating a discrete event simulation model of a process having a process series of steps, the method comprising the steps of:

creating a template having generic tasks;

determining the steps associated with the process, including the time duration of each step and the resources expended in accomplishing each step;

applying the result of the determining steps to the template to create the discrete event simulation model of the process;

accounting for the resources utilized during each determined step of the simulated process; and, calculating resource usage during the course of the simulated process via a common clock, wherein determining steps of the process affecting the time needed to complete the process, but that do not involve critical resource usage, are modeled by advancing parallel, independent virtual clocks.

2. The method according to claim 1, wherein the generic tasks are related in a closed loop system.

3. The method according to claim 1, wherein the generic tasks are modeled as a sequence of computer simulation language components that simulate the dedication of a variety of resources for appropriate lengths of time.

4. The method according to claim 1, wherein the generic tasks are modeled as a sequence of computer simulation language components that perform bookkeeping actions to model the synchronization and control of activities in the simulated process.

5. The method according to claim 1, wherein the generic tasks are modeled as a sequence of computer simulation language components that simulate the dedication of a variety of resources for appropriate lengths of time and that perform bookkeeping actions to model the synchronization and control of activities in the simulated process.

6. The method according to claim 1, wherein the common clock is incremented with a granularity sufficient to capture events at a human level and a computer system level.

7. A method for creating a discrete event simulation model for a process having a series of steps, the method comprising the steps of:

creating a template having generic tasks;

incorporating the template, onto a computer to create a generic computer simulation model;

inputting the steps associated with the process, including the time duration of each step and the resources expended in accomplishing each step;

applying the result of the inputting steps to the generic computer simulation model to create the discrete event simulation model of the process;

accounting for the resources utilized during each step of the simulated process; and calculating resource usage during the course of the simulated process via a common clock, wherein steps of the process affecting the time needed to complete the process, but that do not involve critical resource usage, are modeled by advancing parallel, independent virtual clocks.

8. The method according to claim 7, wherein the generic tasks are related in a closed loop system.

9. The method according to claim 7, wherein the generic tasks are modeled as a sequence of computer simulation language components that simulate the dedication of a variety of resources for appropriate lengths of time.

10. The method according to claim 7, wherein the generic tasks are modeled as a sequence of computer simulation language components that perform bookkeeping actions to model the synchronization and control of activities in the simulated process.

11. The method according to claim 7, wherein the generic tasks are modeled as a sequence of computer simulation language components that simulate the dedication of a variety of resources for appropriate lengths of time and that perform bookkeeping actions to model the synchronization and control of activities in the simulated process.

12. The method according to claim 7, wherein the common clock is incremented with a granularity sufficient to capture events at a human level and a computer system level.

* * * * *